United States Patent
Ohsako et al.

(10) Patent No.: US 7,732,272 B2
(45) Date of Patent: Jun. 8, 2010

(54) METHOD OF MANUFACTURING SEMICONDUCTOR ELEMENT

(75) Inventors: Takashi Ohsako, Miyagi (JP); Hirotaka Mori, Miyagi (JP); Katsuji Yoshida, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 1162 days.

(21) Appl. No.: 10/677,221

(22) Filed: Oct. 3, 2003

(65) Prior Publication Data

US 2004/0097061 A1 May 20, 2004

(30) Foreign Application Priority Data

Nov. 19, 2002 (JP) .............................. 2002-334707

(51) Int. Cl.
*H01L 21/8238* (2006.01)

(52) U.S. Cl. ................. 438/230; 438/229; 438/513; 438/595; 438/660; 438/682

(58) Field of Classification Search ................. 438/199, 438/229, 230, 513, 595, 660, 680, 682, 798, 438/FOR. 168, FOR. 187, FOR. 216
See application file for complete search history.

(56) References Cited

U.S. PATENT DOCUMENTS

| | | | | |
|---|---|---|---|---|
| 4,701,349 A * | 10/1987 | Koyanagi et al. | ............ | 438/655 |
| 4,855,798 A * | 8/1989 | Imamura et al. | ............ | 257/751 |
| 5,023,201 A * | 6/1991 | Stanasolovich et al. | ..... | 438/655 |
| 5,322,815 A * | 6/1994 | Kondo | .......... | 438/625 |
| 5,639,678 A * | 6/1997 | Lee et al. | ..................... | 438/308 |
| 6,157,063 A * | 12/2000 | Iiboshi | ....................... | 257/344 |
| 2003/0032284 A1* | 2/2003 | Enomoto et al. | ............. | 438/687 |

FOREIGN PATENT DOCUMENTS

| | | |
|---|---|---|
| JP | 06-209049 | 7/1994 |
| JP | 07-183515 | 7/1995 |
| JP | 08-222739 | 8/1996 |
| JP | 8-321613 | 12/1996 |
| JP | 10-294290 | 11/1998 |
| JP | 11-345970 | 12/1999 |
| JP | 2000-196082 | 7/2000 |
| JP | 2002-134745 | 5/2002 |

* cited by examiner

*Primary Examiner*—N Drew Richards
*Assistant Examiner*—Joannie A Garcia
(74) *Attorney, Agent, or Firm*—Wenderoth, Lind & Ponack, L.L.P.

(57) ABSTRACT

A method of manufacturing a semiconductor device includes a process of forming a gate electrode having a metallic silicide layer on a semiconductor substrate, a process of decreasing boundaries of grains on the surface of the metallic silicide layer, at least a portion of which is exposed, and a process of forming spacers comprising an oxide film on the side wall of the gate electrode; in this order. Thus, abnormal oxidation of the metallic silicide layer is avoided.

9 Claims, 4 Drawing Sheets

METHOD OF MANUFACTURING SEMICONDUCTOR ELEMENT

BACKGROUND OF THE INVENTION

1. Field of the Invention

The present invention relates to a method of manufacturing a semiconductor element, and especially a semiconductor element which has metallic silicide layer in its gate electrode.

2. Description of the Related Art

As high integration of semiconductor devices proceeds, a demand for faster and finer elements of semiconductors increases. To meet this demand, a gate electrode comprising a metallic silicide layer is adopted for a semiconductor element of MOS structure.

A gate electrode having a metallic silicide layer is formed, for example, as described below.

At first, an isolation of an element is performed. After this, a gate oxide film and a polysilicon film are formed, in this order. Then, a metallic silicide layer is formed on the polysilicon film by a PVD method or a CVD method. A SiN layer is formed on top of the gate electrode with a thermal process using CVD of reduced pressure etc. This thermal process is performed at a comparatively high temperature in a range of 700° C. to 800° C.

After forming in SiN layer, a lithography for forming a gate electrode is performed. In addition, an etching process for forming a gate electrode is performed with this patterned SiN layer used as a mask. Thus, a gate electrode is formed. After this, the photo-resist used for etching is removed.

After removing the photo-resist, oxide films are formed for covering the side walls of the gate electrode with a CVD method of reduced pressure etc.

However, the conventional structure of the gate electrode mentioned above could not sufficiently recover from the damage received during the etching process, because the side wall of the gate electrode was covered with oxide film by a CVD method of reduced pressure. This is a problem to be solved. Moreover, over-etching of the gate oxide film occurs. Consequently, it becomes impossible to compensate for thinning of the gate oxide film. As a result, there was another problem of causing leakage of the gate.

Therefore, in order to prevent leakage of the gate, a method of performing heat oxidation treatment is generally used. But, in the method mentioned above, a heat treatment for forming SiN layer was necessary. Therefore, the metallic silicide was crystallized, and, the crystal was in a state that oxygen was likely to diffuse. An oxidation process in this state caused increasing oxidation of metal of W. and Si, and expansion of volume occurred. Therefore, difference of stress occurred between polysilicon and metallic silicide in the lower portion of the metallic silicide layer. A difference of stress also occurred between the metallic silicide and SiN layer in the upper portion of metallic silicide layer. As a result, fastening between the metallic silicide layer and SiN deteriorated, and peeling off of the SiN layer occurred.

That is, according to the method mentioned above, a gate electrode 40 comprising polysilicon layer 42, metallic silicide layer 43, and SiN layer 44 was formed. When its surface was observed, the state of the surface shown in FIG. 5(b) was recognized. In FIG. 5(b), metallic silicide crystal 45 grew like notches in the horizontal direction, because the side wall of gate electrode 40 was abnormally oxidized. In addition, SiN layer 44 was likely to peel off due to abnormal oxidation as mentioned above.

As a method of preventing abnormal oxidation mentioned above, a method of implanting nitrogen in the side wall of gate electrode 40 has been suggested (c.f. JP 08-321613).

However, the conventional method has a problem in that voids (vacancies) occur because of nitrogen implanted in the semiconductor substrate.

SUMMARY OF THE INVENTION

Therefore, the present invention is aimed at providing a method of manufacturing semiconductor substrate which can restrain the occurrence of abnormal oxidation under heat treatment at a high temperature after forming a metallic silicide layer.

The problem mentioned above can be solved because the present invention includes the following. First, a method of manufacturing a semiconductor element includes: forming a gate electrode having a metallic silicide layer on a semiconductor substrate, decreasing grain boundaries on the surface of the metallic silicide at least at a portion which is exposed, and forming a spacer consisting of oxide film on the side wall of the gate electrode.

Second, in a method of manufacturing a semiconductor element according to the first method, the process of decreasing the grain boundaries is a process of performing heat treatment to the metallic silicide layer in an atmosphere consisting of a chief element of nitrogen gas.

Third, in a method of manufacturing a semiconductor element according to the first method, the process of decreasing the grain boundaries is a process of performing heat treatment to the metallic silicide layer in an atmosphere consisting of a chief element of argon gas.

Fourth, in a method of manufacturing a semiconductor element according to the first method, the process of decreasing the grain boundaries is a process of performing heat treatment to the metallic silicide layer in an atmosphere consisting of a mixture gas of chief elements of nitrogen and ammonia.

Fifth, in a method of manufacturing a semiconductor element according to the first method, the process of decreasing the grain boundaries is performed after performing a reduced pressure process.

These methods include a process of decreasing grain boundaries after forming a metallic silicide layer. Therefore, occurrence of abnormal oxidation in the side wall of the gate electrode can be restrained, even if a process of treatment at high temperature is performed after the process of decreasing grain boundaries.

Here, the process of decreasing grain boundaries means a process of performing heat treatment to the metallic silicide layer, at least a portion of which is exposed in an atmosphere of inoxidizable gas consisting of a chief element of nitrogen, argon, or mixture gas of nitrogen and ammonia.

Moreover, for example, a chief element of nitrogen means an atmosphere including more than 99% density of nitrogen gas. Especially, it means an atmosphere including less than 100 ppm of oxidizable gas (oxygen gas etc.). Incidentally, other inoxidizable gas can be included if the gas mentioned above is a chief element and the density of oxidizable gas is less than 100 ppm.

DETAILED DESCRIPTION OF THE PREFERRED EMBODIMENTS

Figure 1A:
FIGS. 1(a) to (d) are sectional views of a semiconductor element in the process of an Embodiment of the present invention.

Hereafter, Embodiments 1 to 4 of the method of manufacturing a semiconductor element according to present invention will be described, referring to the drawings.

Embodiment 1

Embodiment 1 of the manufacturing method of the present invention comprises a process of forming a gate electrode having a metallic silicide layer on a semiconductor substrate, a process of performing heat treatment of the metallic silicide layer (at least a portion of which is exposed) in a gas atmosphere consisting of a chief element of nitrogen (a heat treatment process of metallic silicide layer), and a process of forming spacers comprising oxide films on the side walls of the gate electrode; in this order.

Figure 1B:
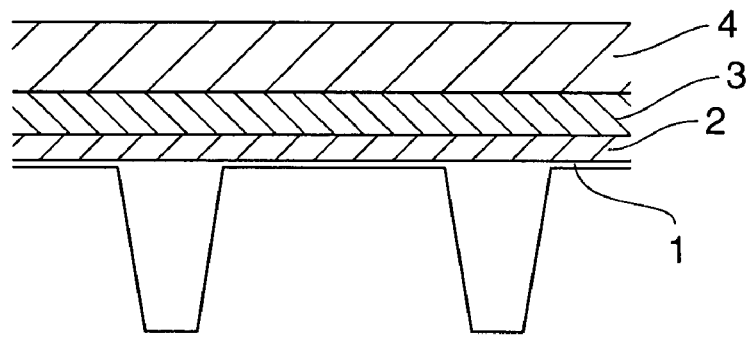

At first, an isolation of an element is performed, as shown in FIG. 1(a), by a method which is the same as the conventional method known in public. After isolating an element, a gate oxide film 1 and a polysilicon layer 2 are formed, as shown in FIG. 1(b), by a method known in public. Then, an ion implantation is performed so as to introduce an impurity to the polysilicon layer 2 to make an electrode from it. In addition, a metallic silicide layer 3 is formed on the polysilicon layer 2 by a PVD method or a CVD method. Here, the temperature for forming the metallic silicide layer 3 is preferably 400° C. to 600° C. After forming the metallic silicide layer 3, a heat treatment at a temperature higher than that for forming the metallic silicide layer 3 is performed. Here, the temperature of this heat treatment is preferably 700° C. to 800° C.

Incidentally, the manner of heat treatment is not limited at all. The heat treatment can be performed together with a process of forming an SiN layer 4, which becomes a hard mask for forming a gate and a mask for making self-aligned contact, on the top of the gate electrode.

On this occasion, the SiN layer 4 is preferably formed by a CVD method of reduced pressure, which can make a minute film with little H included. The heat treatment by this CVD with reduced pressure is performed at a temperature higher than the temperature for forming the metallic silicide layer 3.

Figure 1C:
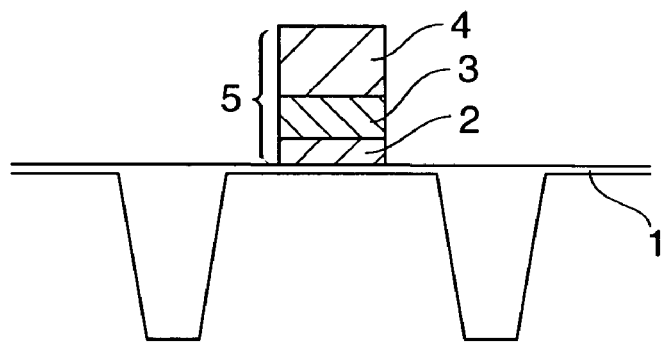

After forming the SiN layer 4, a photolithography for forming a gate electrode 5 is performed, as shown in FIG. 1(c), and, an etching for forming a gate (process of forming the gate electrode) is performed. By this gate etching, the side walls of the portions of metallic silicide layer 3 are exposed.

After forming the gate electrode 5, a heat treatment (process of heat treatment of the metallic silicide layer) is performed. This is performed in a gas atmosphere including nitrogen as a chief element, in a chamber of heat treating apparatus (RTA) purged with nitrogen, for example.

The temperature of heat treatment in the heat treatment process of the metallic silicide layer is preferably 700 to 800° C. in a view point of decreasing grain boundaries of silicide crystal without fail. The process time is preferably 30 to 40 sec. in the same point of view.

Since the gas atmosphere in the chamber consists of a chief element of nitrogen, the gas atmosphere consists of little oxidizable gas. That is, the density of oxidizable gas in the atmosphere is less than 100 ppm. Therefore, diffusion of oxygen in the metallic silicide layer 3 is contained, and, abnormal oxidation can be prevented. Moreover, the grain boundary of the silicide crystal in the side wall decreases. Therefore, diffusion of oxygen or moisture after forming the gate can be prevented.

Moreover, nitrogen gas is convenient for manufacturing devices, because it is easy to use and not expensive.

Figure 1D:
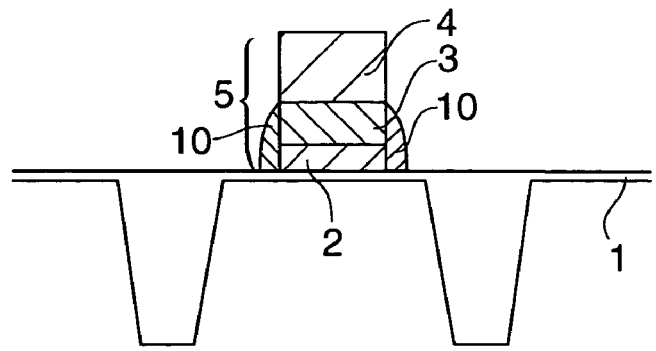

After performing heat treatment in the process of treating the metallic silicide layer with heat, an oxidizing treatment is performed in a common furnace. By performing this oxidizing treatment, as shown in FIG. 1(d), spacers comprising oxide film 10, 10 are formed on the side walls of the polysilicon layer and tungsten silicide layer, and on the gate oxide film. Incidentally, these spacers are used as a mask layer for forming an LDD (Lightly Doped Drain) structure, and as a protection layer for protecting the side walls of the gate electrode.

In the heat treatment mentioned above, the atmosphere for performing the heat treatment can include either oxygen or oxygen with moisture, because diffusion of oxidizing substance in the metallic silicide layer is restrained. Moreover, in order to obtain a preferable thickness of an oxide film, the atmosphere, process temperature, process time, gas flow quantity etc. can be set voluntarily.

Figure 2:
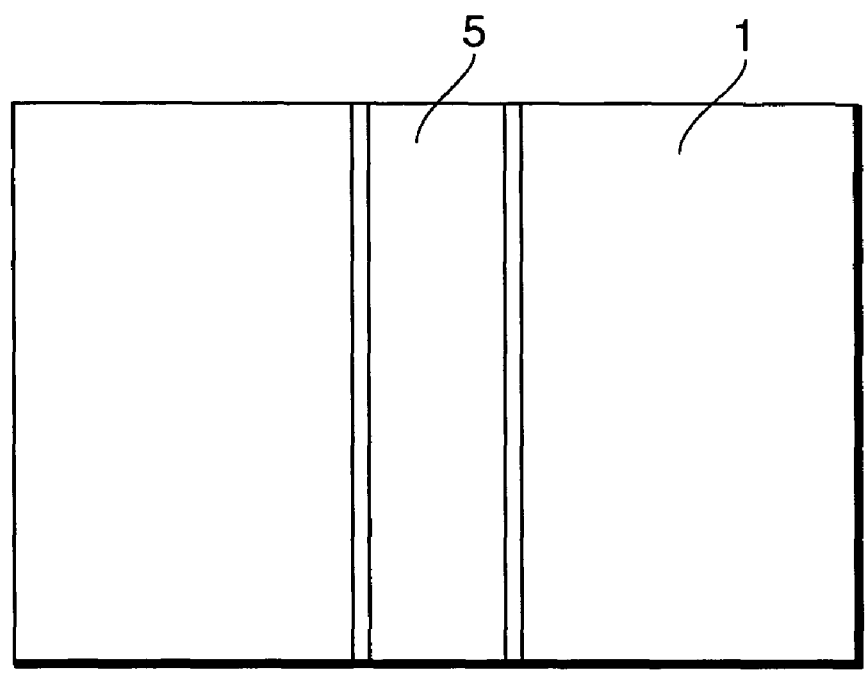
FIG. 2 is a plan view of the gate electrode formed by the method of the present invention.
Figure 5A:
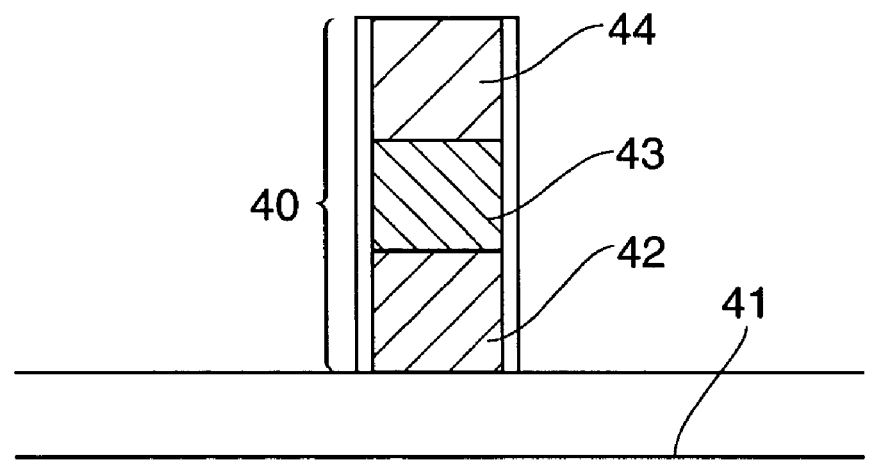
FIG. 5(a) is a sectional view of a gate electrode formed by the conventional art.
Figure 5B:
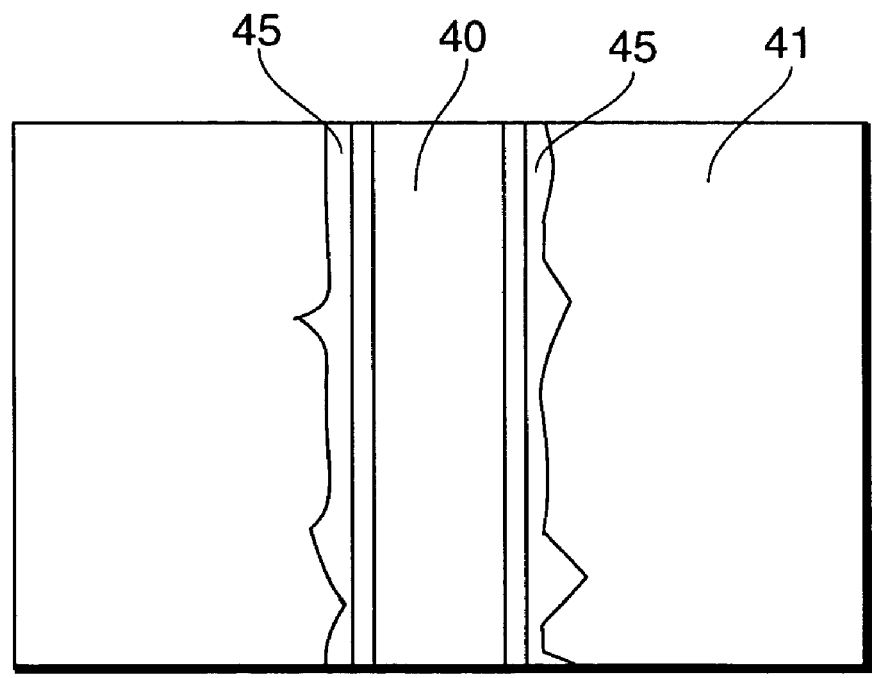
FIG. 5(b) shows a state of abnormal oxidation of gate electrode.

FIG. 2 shows a top surface of the gate electrode 5 formed by the manufacturing method of Embodiment 1. In FIG. 2, what is formed vertically in the central portion of the figure is the gate electrode 5. Moreover, what is formed at each side of the gate electrode 5 is the gate oxide film. As apparently shown in FIG. 2, abnormal oxidation resulting in deposition of notched crystal described referring to FIG. 5(b) does not come out on the side walls of gate electrode 5. That is, by the manufacturing method of the present invention, the side wall of the gate electrode is oxidized uniformly without any abnormal oxidization.

As described above, according to the manufacturing method of Embodiment 1, abnormal oxidation can be prevented when the side wall is oxidized after forming the gate electrode, in any condition such as atmosphere (only oxygen or with moisture), process temperature, process time, gas flow quantity etc.

Embodiment 2

The manufacturing method of Embodiment 2 of the present invention comprises a process of forming a gas electrode having a metallic silicide layer on a semiconductor substrate, a process of performing heat treatment of the metallic silicide layer, at least a portion of which is exposed in an atmosphere consisting of a chief element of argon gas, and a process of forming spacers comprising an oxide film on each side of the gate electrode; in this order.

The manufacturing method of Embodiment 2 is the same as the manufacturing method of Embodiment 1 except for the process of treating the metallic silicide layer with heat. The chief element of the gas atmosphere for heat-treatment is not nitrogen, but argon.

After forming a gate electrode 5 as well as the manufacturing method of Embodiment 1, heat-treatment in an atmosphere of a chief element of argon gas is performed in a chamber of a heat-treating apparatus (RTA) purged with argon gas. Here, the chief element of argon gas means that the density of argon in the gas atmosphere is not less than 99%, and, especially, the density of oxidizable gas (oxygen gas etc.) is not more than 100 ppm.

In an atmosphere of a chief element of argon gas, abnormal oxidation can be prevented as well as nitrogen gas. Moreover, a method of using argon gas of Embodiment 2 is profitable when nitrization of a source region or a drain region of the semiconductor substrate must be avoided.

Incidentally, the process temperature, the process time etc. of the heat-treatment condition is the same as the manufacturing method of Embodiment 1.

In addition, spacers comprising an oxide film are formed on the side wall of the gate electrode as in Embodiment 1, after performing a heat-treating process of the metallic silicide layer, which is performed in the argon gas atmosphere of the chief element.

Embodiment 3

The manufacturing method of Embodiment 3 comprises a process of forming a gate electrode having a metallic silicide layer on a semiconductor substrate, a process of performing heat-treatment in an atmosphere of a chief element of a mixture gas consisting of nitrogen and ammonia, and a process of forming spacers comprising an oxide film on the side wall of the gate electrode; in this order.

The method of Embodiment 3 is the same as Embodiment 1 except the heat-treating process of the metallic silicide layer. The heat-treatment in a gas atmosphere of the chief element is not nitrogen but a mixture gas of nitrogen and ammonia.

At first, a gate electrode 5 is formed as in Embodiment 1. After this, a chamber is purged with nitrogen gas so as to make the density of oxidizable gas less than 100 ppm. Subsequently, the wafer is placed in the chamber of the heating apparatus so as to heat it with a lamp.

In the meantime, the wafer is heated up to a prescribed temperature. Then, ammonia gas is introduced into the chamber. And, an atmosphere of mixture gas consisting of nitrogen and ammonia is made. Then, a heat-treatment is made. The temperature in this occasion is preferably not less than 650° C., and it is still preferable if it is 700 to 800° C.

The density of ammonia gas in the atmosphere is preferable if it is 1 to 3%, provided that the nitrified region mentioned later is formed in a reasonable range.

Spacers comprising an oxide film are formed on the side wall of the gate electrode as in Embodiment 1, after performing the heat-treating process on the metallic silicide layer, which is performed in the atmosphere of mixture gas of chief elements of nitrogen and ammonia.

Figure 3:
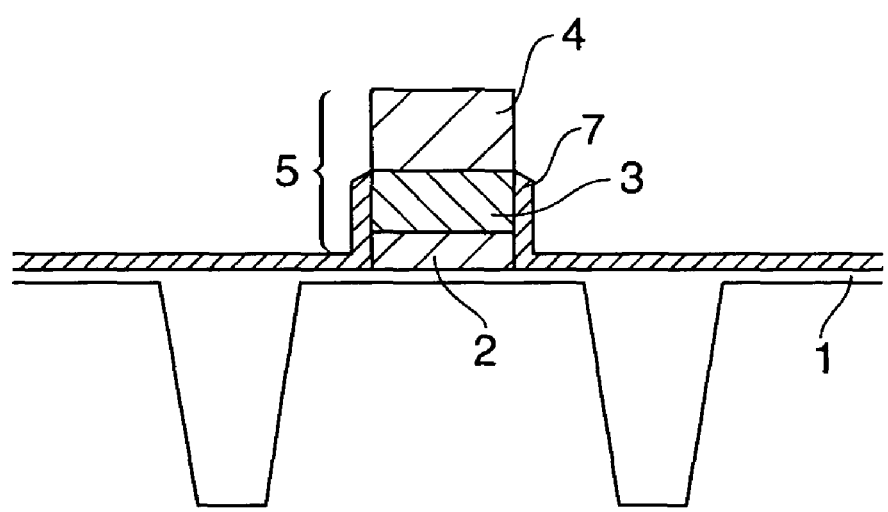
FIG. 3 is a sectional view of the gate electrode formed by the method of Embodiment 2 of the present invention.

According to the method of Embodiment 3, abnormal oxidation on the side wall does not occur. As shown in FIG. 3, nitrified region 7 is formed in a range of the side wall to the bottom portion of metallic silicide layer 3 assisted by the ammonia gas. Therefore, nitrogen of high density is introduced into the oxide film on the substrate except the portion under gate electrode 5. As a result, diffusion of impurities from the substrate to the spacers formed on the side wall of gate electrode 5 can be prevented.

After performing heat-treatment mentioned above, oxidizing treatment is performed in a common oxidizing furnace as in Embodiment 1. The gas in the furnace as an atmosphere in this occasion preferably consists of a chief element of nitrogen. In the meantime, the furnace is heated up to a preferable temperature. Subsequently, a gas for oxidizing is introduced there.

This gas may consist of oxygen or moisture.

Embodiment 4

The method of Embodiment 4 of the present invention comprises a process of forming a gate electrode having a metallic silicide layer on a semiconductor substrate, a process of performing heat-treatment of the metallic silicide layer, at least a portion of which is exposed in an atmosphere of a chief element of nitrogen gas (heat-treating process of metallic silicide layer), and a process of forming spacers comprising an oxide film on the side wall of the gate electrode; in this order. The heat-treating process of metallic silicide layer is performed after a process of performing a reduced pressure treatment (reduced pressure treating process).

At first, etching for forming the gate is performed as in Embodiment 1. After etching to form the gate, the photoresist used for etching is removed, and a gate electrode is formed. After this, the reduced pressure treating process is performed by using a low pressure CVD device, for example. Subsequently, a heat-treatment in an atmosphere of a chief element of nitrogen gas is performed as in Embodiment 1.

The reduced pressure treatment is performed by taking the semiconductor substrate forming the gate electrode in the furnace at its temperature of less than 550° C.

By performing the reduced pressure treatment, the density of oxygen on the surface of the wafer (density of oxidizable gas) can be made less than 100 ppm.

After performing the reduced pressure process, the wafer is heated up. Heat treatment in an atmosphere of a chief element of nitrogen gas at 700 to 800° C. is performed as in Embodiment 1 (heat treating process of the metallic silicide layer).

In this occasion, if the wafer is heated up without performing the reduced pressure process, abnormal oxidation occurs, because the density of oxygen between wafers is high.

The pressure of the reduced pressure process is preferably 13 to 65 Pa.

After performing heat treatment at more than 650° C., the wafer is cooled down to the process temperature or inletting temperature. Then, the wafer is taken out. After this, a spacer comprising an oxide film is formed on the side wall of the gate electrode as in Embodiment 1.

According to Embodiment 4, the density of the oxidizable gas is efficiently decreased. Moreover, the heat treating process of metallic silicide layer after the reduced pressure process can be performed in processing apparatus, which can process a batch of wafers. Therefore, productivity can increase.

Next, an example of the manufacturing method of a NMOS-FET having an LDD structure is described referring to FIG. 1 and FIG. 4.

Figure 4A:
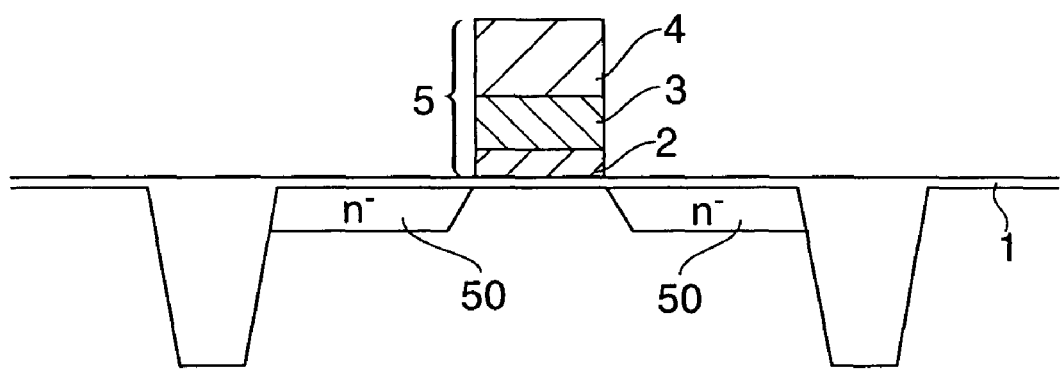
FIGS. 4(a) and (b) are sectional views of a NMOS-FET having an LDD structure manufactured by the method of the present invention.

At first, as mentioned before in the description with reference to FIG. 1(a) to FIG. 1(c), gate electrode 5 (generally polysilicon) is formed on the semiconductor substrate 1. Next, as shown in FIG. 4(a), phosphorus is introduced by ion implantation using the gate electrode 5 as a mask. By this, shallow n$^-$ layer 50 is formed all over the source and drain region of semiconductor substrate 1.

Figure 4B:
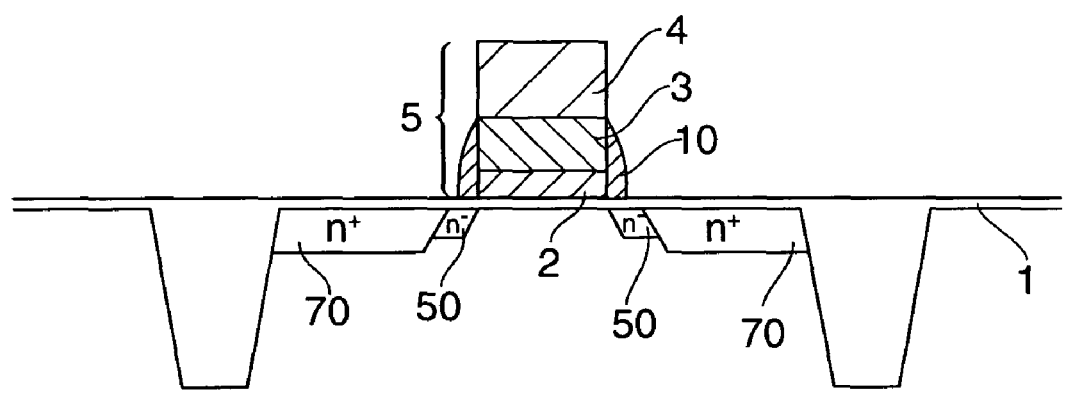

After this, as shown in FIG. 4(b), an oxide film 10 (side wall) is formed on the side wall of gate electrode 5.

This oxide film 10 is formed with the condition mentioned before (condition described in Embodiments 1 to 4). By this, the gate electrode with restrained abnormal oxidation can be formed.

After forming oxide film 10, arsenic is introduced by ion implantation using oxide film 10 and gate electrode 5 as a mask. By this, deep n⁺ layer 70 is formed on the portion of the source and drain region distant from the gate electrode 5. After this, wiring etc. is performed. Then, NMOS-FET of LDD structure is manufactured.

Incidentally, the manufacturing method mentioned above is not only applied to NMOS-FET, but is also applied to various semiconductor elements such as CMOS-FET etc.

And, the present invention is not limited to Embodiments 1 to 4.

For example, the material of the metallic silicide layer is not limited to

Tungsten silicide, which is preferable in practical use. That is, molybdenum silicide or titanium silicide etc. is available.

Moreover, if the heat treatment after forming the metallic silicide layer is performed at a temperature higher than the temperature of forming the metallic silicide, an SiN layer formed by a reduced pressure CVD method is not always necessary.

What is claimed is:

1. A method of manufacturing a semiconductor element, comprising:
    forming a gate electrode on a semiconductor substrate, the gate electrode having a metallic silicide layer, a metallic polysilicon layer under the metallic silicide layer, and an SiN layer on the metallic silicide layer;
    after said forming of the gate electrode including the SiN layer, decreasing grain boundaries on a surface of the metallic silicide layer, at least a portion of the surface of the metallic silicide layer being exposed, said decreasing of the grain boundaries comprising performing a heat treatment on the metallic silicide layer in an atmosphere consisting of a mixture gas of chief elements of nitrogen and ammonia and an oxidizable gas of less than 100 ppm; and
    forming a spacer consisting of an oxide film on a side wall of the metallic polysilicon layer and the metallic silicide layer of the gate electrode;
    wherein said decreasing of the grain boundaries is performed after performing a reduced pressure process.

2. The method of claim 1, wherein said forming of the spacer is performed after said decreasing grain boundaries on the surface of the metallic silicide layer.

3. A method of manufacturing a semiconductor element, comprising:
    forming a gate electrode on a semiconductor substrate, the gate electrode having a metallic silicide layer, a metallic polysilicon layer under the metallic silicide layer, and an SiN layer on the metallic silicide layer;
    after said forming of the gate electrode including the SiN layer, decreasing grain boundaries on a surface of the metallic silicide layer, at least a portion of the surface of the metallic silicide layer being exposed, said decreasing of the grain boundaries being performed after performing a reduced pressure process and comprises performing a heat treatment on the metallic silicide layer in an atmosphere including an oxidizable gas of less than 100 ppm; and
    forming a spacer consisting of an oxide film on a side wall of the metallic polysilicon layer and the metallic silicide layer of the gate electrode.

4. The method of claim 3, wherein said decreasing of the grain boundaries comprises performing a heat treatment on the metallic silicide layer in an atmosphere consisting of a chief element of nitrogen gas.

5. The method of claim 3, wherein said decreasing of the grain boundaries comprises performing a heat treatment on the metallic silicide layer in an atmosphere consisting of a chief element of argon gas.

6. The method of claim 3, wherein the metallic silicide layer comprises a tungsten silicide layer, and said decreasing of the grain boundaries comprises performing a heat treatment on the metallic silicide layer at temperature in a range of 700° C. to 800° C. for a time period in a range of 30 seconds to 40 seconds.

7. The method of claim 3, wherein said decreasing of the grain boundaries comprises performing a heat treatment on the metallic silicide layer in an atmosphere including an oxidizable gas, and said reduced pressure process comprises reducing the oxidizable gas level to less than 100 ppm.

8. The method of claim 3, wherein the metallic silicide layer comprises a tungsten silicide layer, and said decreasing of the grain boundaries comprises performing a heat treatment on the metallic silicide layer at a temperature in a range of 700° C. to 800° C. and after said performing of the reduced pressure process at a pressure of 13 Pa to 65 Pa.

9. The method of claim 3, wherein said forming of the spacer is performed after said decreasing grain boundaries on the surface of the metallic silicide layer.

* * * * *